United States Patent
Swami et al.

(10) Patent No.: US 7,154,299 B2
(45) Date of Patent: Dec. 26, 2006

(54) ARCHITECTURE FOR PROGRAMMABLE LOGIC DEVICE

(75) Inventors: Parvesh Swami, New Delhi (IN); Namerita Khanna, New Delhi (IN); Deepak Agarwal, Noida (IN)

(73) Assignee: STMicroelectronics Pvt. Ltd. (IN)

(*) Notice: Subject to any disclaimer, the term of this patent is extended or adjusted under 35 U.S.C. 154(b) by 0 days.

(21) Appl. No.: 10/407,802

(22) Filed: Apr. 4, 2003

(65) Prior Publication Data

US 2003/0214321 A1    Nov. 20, 2003

(30) Foreign Application Priority Data

Apr. 5, 2002    (IN)    ............................ 432/02

(51) Int. Cl.
*H03K 19/177*    (2006.01)
(52) U.S. Cl. ...................... 326/41; 326/40; 326/113
(58) Field of Classification Search ............ 326/37–41, 326/46, 47, 101, 113
See application file for complete search history.

(56) References Cited

U.S. PATENT DOCUMENTS

| | | | | |
|---|---|---|---|---|
| 4,963,770 A | * | 10/1990 | Keida ........................... | 326/40 |
| 5,592,106 A | * | 1/1997 | Leong et al. .................. | 326/41 |
| 5,809,281 A | * | 9/1998 | Steele et al. ................. | 711/170 |
| 5,883,525 A | | 3/1999 | Tavana et al. | |
| 6,185,719 B1 | * | 2/2001 | Sako ............................ | 716/1 |
| 6,268,743 B1 | * | 7/2001 | Kaptanoglu .................. | 326/40 |
| 6,590,419 B1 | * | 7/2003 | Betz et al. .................... | 326/47 |
| 6,621,298 B1 | * | 9/2003 | Agrawal et al. .............. | 326/50 |

* cited by examiner

*Primary Examiner*—Vibol Tan
(74) *Attorney, Agent, or Firm*—Lisa K. Jorgenson; J. Mark Han; Graybeal Jackson Haley LLP

(57) ABSTRACT

An improved Programmable Logic Device architecture that provides more efficient utilization of resources by enabling access to defined circuit elements in the domain of any Programmable Logic Block (PLB) from any other PLB in the device, by incorporating a connecting means in the routing structure for selectively connecting the input or output of the circuit element in the domain of the PLB to the common interconnect matrix connecting all the PLBs together.

25 Claims, 8 Drawing Sheets

US 7,154,299 B2

ARCHITECTURE FOR PROGRAMMABLE LOGIC DEVICE

PRIORITY CLAIM

This application claims priority from Indian patent application No. 432/Del2002, filed Apr. 5, 2002, which is incorporated herein by reference.

FIELD OF THE INVENTION

This invention relates generally to an improved programmable logic device architecture, and more particularly to an improved Field Programmable Gate Array (FPGA) architecture that provides more efficient utilization of resources by enabling access to circuit elements in the domain of one Programmable Logic Block (PLB) from other PLBs.

BACKGROUND OF THE INVENTION

Field Programmable Gate Arrays (FPGAs) are general-purpose logic devices that can be configured to provide any desired logic function within the range of capabilities of the FPGA. Each FPGA comprises, internally, one or more Programmable Logic Blocks (PLBs) that can be interconnected at their outputs and inputs through a programmable interconnection matrix. Each PLB includes logic-circuit elements that can be programmed to interconnect in one of several possible ways. The range of capabilities provided by each PLB is defined by the set of logic-circuit elements available. A PLB is incapable of providing functionality that requires any additional logic circuit elements.

In several applications, logic circuit elements in some PLBs remain unutilized or underutilized while other PLBs are limited by the availability of insufficient quantities of logic-circuit elements. This situation results in inefficient utilization of the FPGAs resources. In these conditions, it would prove beneficial if the unutilized logic circuit elements in one PLB could be utilized by other PLBs. Current FPGA architectures do not provide any means to permit the sharing of logic-circuit elements between PLBs. This limitation is particularly applicable to sequential-logic elements.

U.S. Pat. No. 5,883,525 describes an FPGA architecture that provides an arrangement for reducing the chip area of an FPGA by minimizing the programmable interconnection points in the programmable routing matrix. However, this invention does not provide any mechanism for enabling access to internal logic elements of a PLB.

SUMMARY OF THE INVENTION

An embodiment of the invention overcomes the above-mentioned drawbacks and provides an FPGA architecture that enables more efficient utilization of logic-circuit elements.

This embodiment provides an improved Programmable Logic Device architecture that provides more efficient utilization of resources by enabling access to defined circuit elements in the domain of any Programmable Logic Block (PLB) from any other PLB in the device, by incorporating a routing means that selectively connects the input or output of the circuit element in the domain of the PLB to the common interconnect matrix connecting all the PLBs together.

The routing means may be a controlled gate structure that selectively enables the input or output of the circuit element to the interconnect matrix, based on the value of a selection input. The said routing means may provide bi-directional access to the input or output of at least some defined circuit elements. The defined circuit elements may be combinatorial- or sequential-logic elements or combinations thereof.

At least one of the defined logic circuit elements is typically a sequential logic-circuit element.

Another embodiment provides a method for improving the utilization of FPGA resources by enabling access to defined logic circuit elements in the domain of any PLB by selectively connecting the input or output of any such logic circuit element to the common interconnect matrix connecting all the PLBs together.

The selective connection may be accomplished by connecting a particular input or output of the logic circuit element to the interconnect matrix, based on the value of a selection input.

The selective connection may provide bi-directional access.

BRIEF DESCRIPTION OF THE DRAWINGS

Various embodiments of the invention will now be explained with the help of the accompanying drawings.

DETAILED DESCRIPTION

Figure 1:
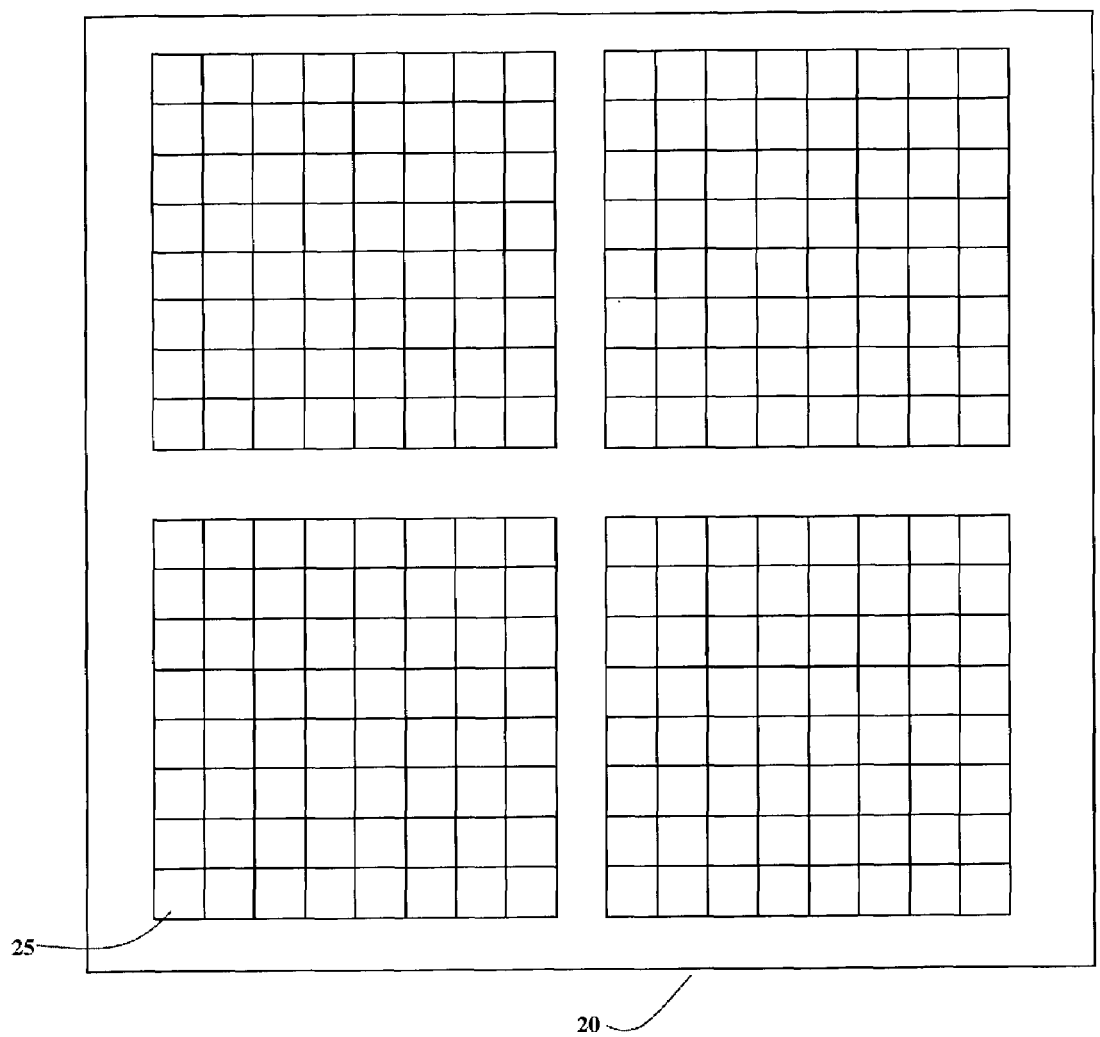
FIG. 1 is the top level diagram of an FPGA according to the conventional architecture, showing the "tiled" structure.

As shown in FIG. 1, a conventional FPGA 20 generally consists of an array of tiles 25 that collectively provide configurable logic-circuit element resources. The tiles 25 are programmatically interconnected to provide the desired set of functions using the resources available in one or more tiles 25.

Figure 2:
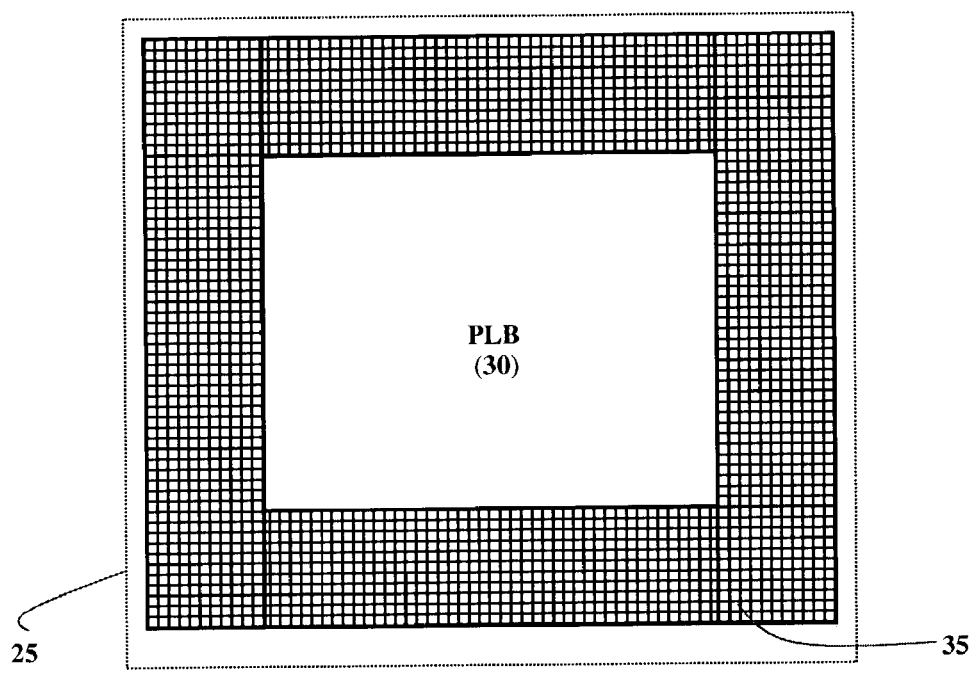
FIG. 2 shows the internal structure of a "tile" in a conventional FPGA.

FIG. 2 shows the internal structure of a conventional tile 25. Each tile 25 is made up of a programmable logic block (PLB) 30 and routing resources 35 that connect its input and output signals with other PLBs (not shown). A PLB 30 is also termed a Configurable Logic Block (CLB), a Configurable Logic Element (CLE) or a Programmable Function Unit (PFU). A PLB 30 typically includes the circuitry in which logic can be implemented in programmable logic devices.

Figure 3:
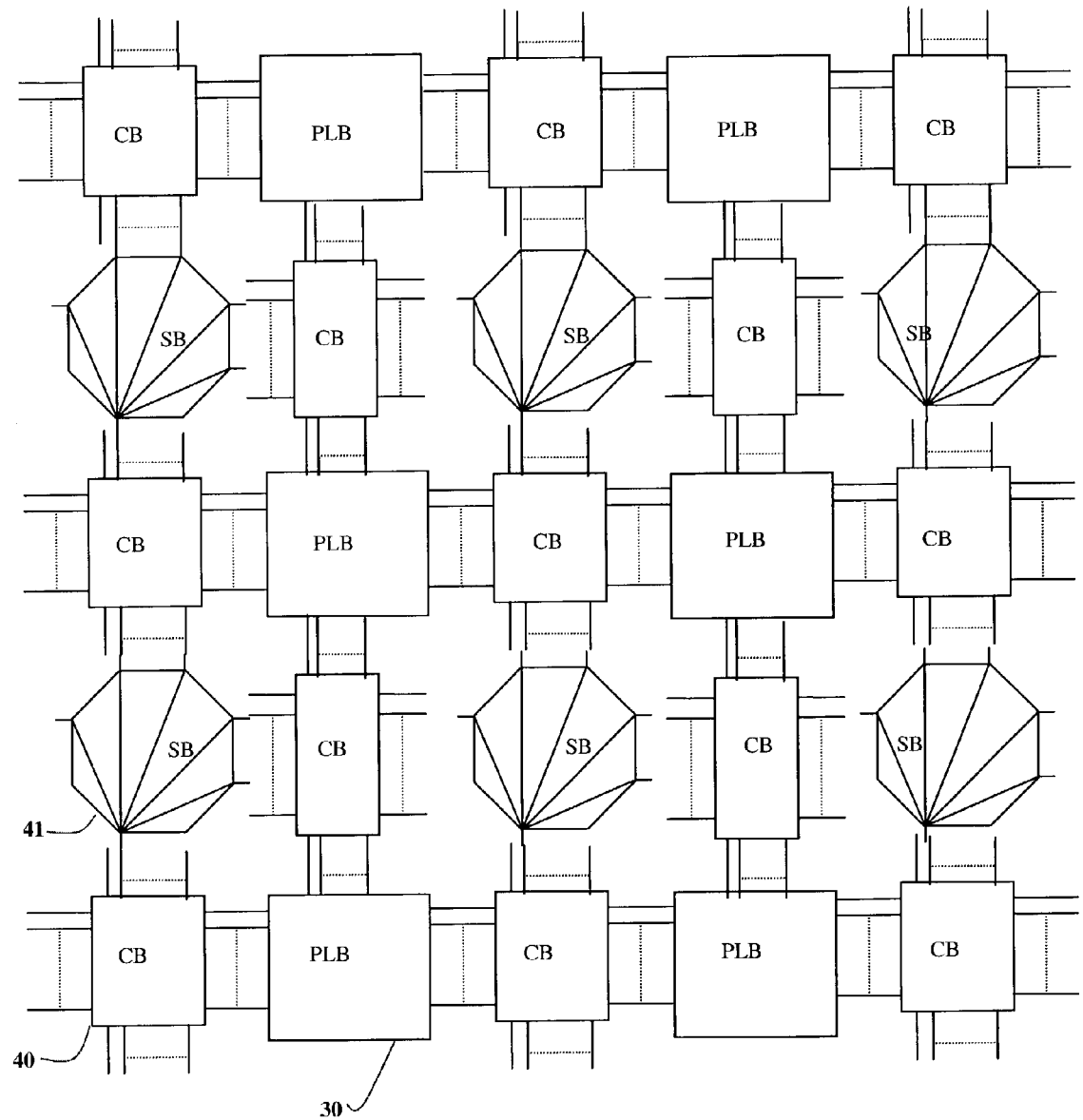
FIG. 3 shows the arrangement for interconnecting the "tiles" in a conventional FPGA.

The interconnection between tiles 25 in existing FPGA architectures is shown in FIG. 3. A PLB 30 in one tile 25 is connected with PLBs in other tiles 25 using routing resources in the form of a Connection Bloc (CB) 40 and a Switching Block (SB) 41. The Connection Block (CB) 40 provides the facility to select one or more other PLB outputs and/or inputs for connecting to one or more PLBs. Each output from a Connection Block (CB) 40 is connected to a programmable Switching Block (SB) 41 that enables a circuit connection to the output/input of one or more selected PLBs.

Figure 4:
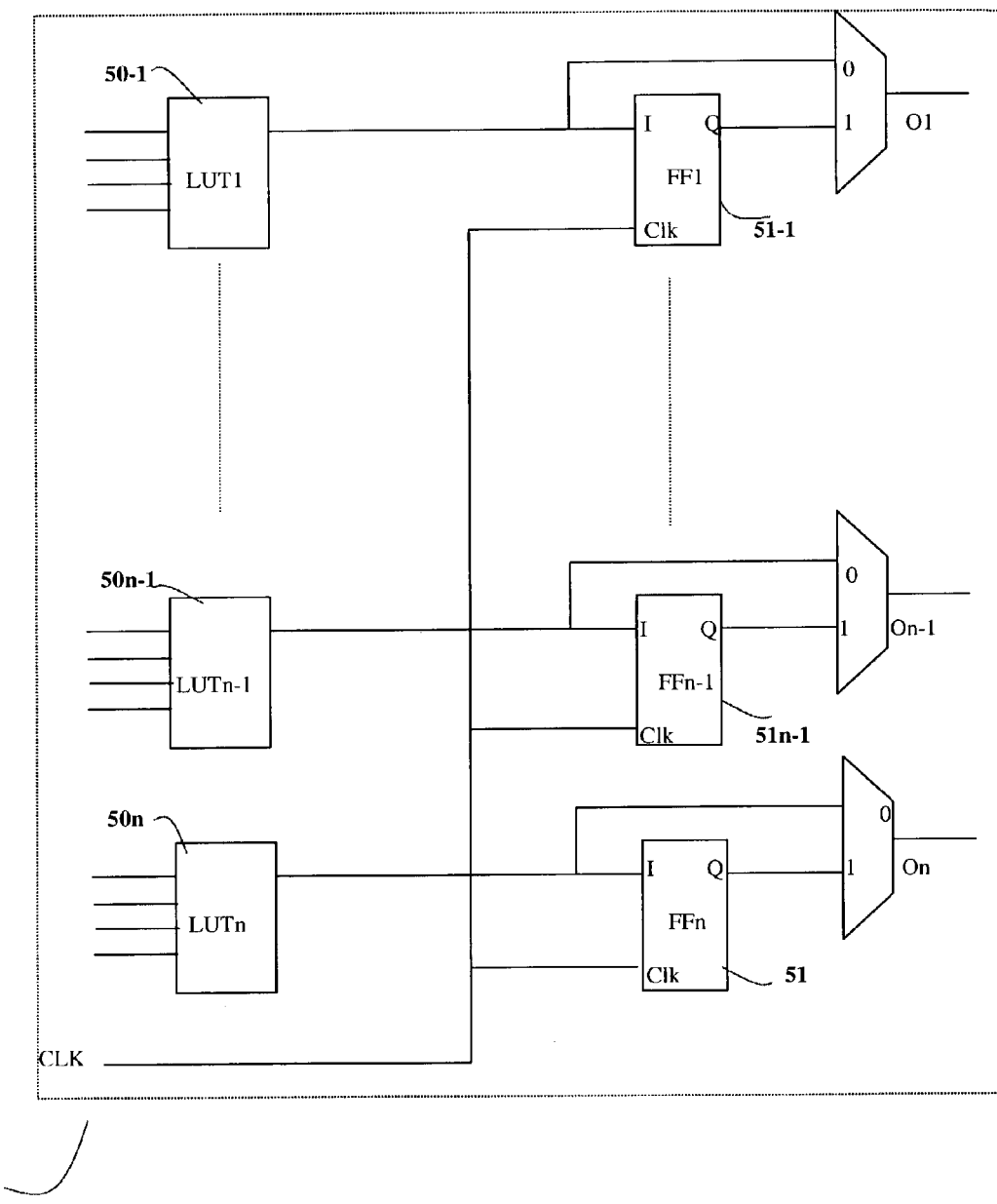
FIG. 4 shows the block diagram of a Programmable Logic Block (PLB) in a conventional FPGA.

FIG. 4 shows the internal structure of a conventional PLB 30. Each PLB 30 often includes one or more input lines, one or more output lines, one or more latches, and one or more Look Up Tables (LUT) 50 with sequential logic-elements 51 such as a D flip-flop. The LUT 50 can be programmed to perform various functions including general combinatorial- or control-logic functions, read only memory (ROM), or random access memory (RAM) operations or to function as a data path between the input and output lines. In this manner, the LUT 50 determines whether the PLB 30 performs general logic, or operates in a special mode such as an adder, a subtracter, a counter, a register, or a memory cell and thereby, whether or not it utilizes a sequential-logic element 51. The sequential-logic elements 51 may be used as registering elements within the same programmable logic block (PLB) 30. However, these sequential-logic elements 51 cannot be used to register functions from other PLBs.

Figure 5:
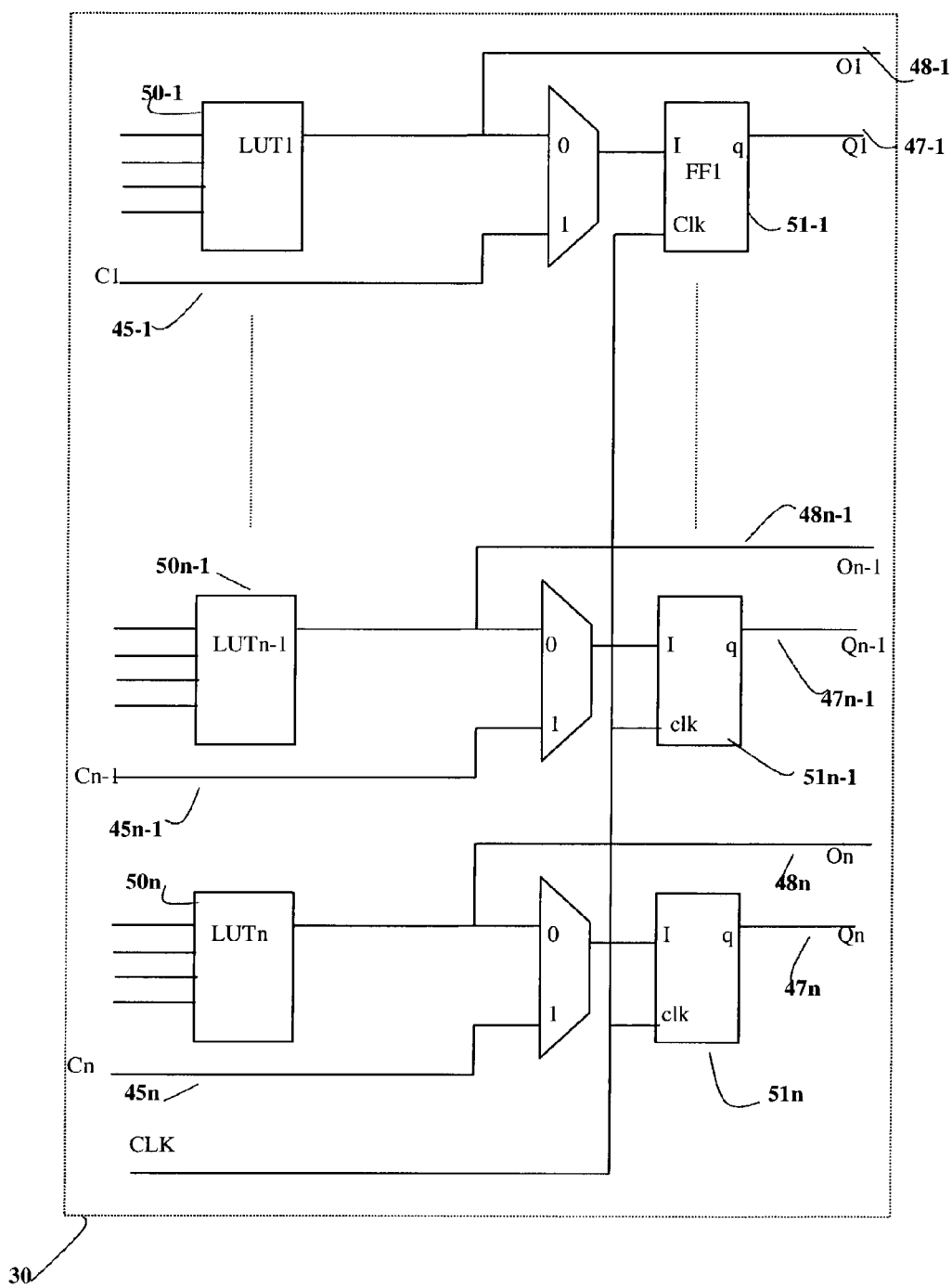
FIG. 5 shows a conventional modification of the PLB to provide access to the sequential-logic elements from outside the PLB.

FIG. 5 shows a conventional modified PLB 30 that incorporates the facility to utilize the sequential-logic elements of one PLB to register functions from other PLBs. Additional input pins C 45 connect to desired outputs of other PLBs and provide access to the input of the sequential logic elements 51. Unregistered output O 48 is simultaneously available with the registered output Q 47. However, this approach requires additional dedicated pins for the additional inputs/outputs 45 and 47 which reduces the pins-to-functionality ratio of the programmable logic block 30. These additional inputs and outputs 45 and 47 also increase the routing resources, which results in increased silicon area and additional delays.

Figure 6:
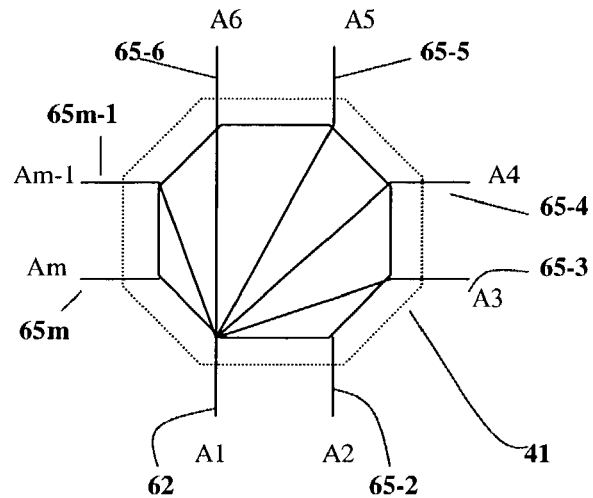
FIG. 6 shows the diagram of a conventional interconnecting circuit block.

FIG. 6 shows a conventional programmable routing matrix 41 with the capability to connect a signal A1 62 with m points A2–Am 65. Each connection is individually programmable and it is, therefore, possible to select as many connections as desired.

Figure 7:
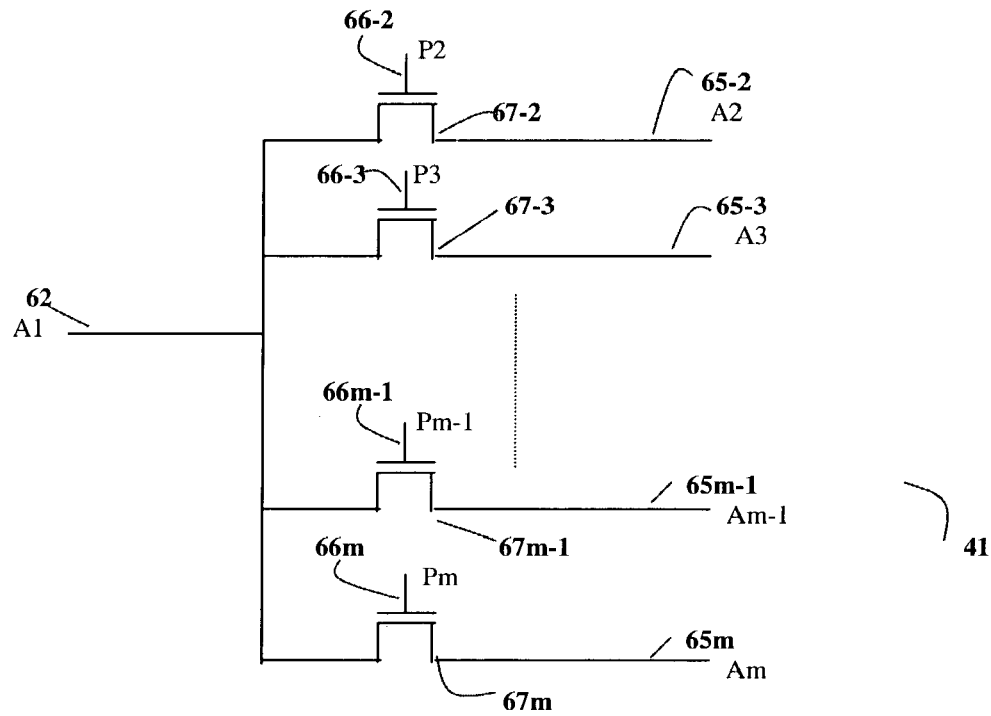
FIG. 7 shows the internal circuit diagram of a conventional interconnecting circuit block.

FIG. 7 shows a schematic of the conventional routing matrix 41 of FIG. 6. Signal A1 62 can be connected to any (or all) other points A2–Am 65 by programming the control lines P2–Pm 66 to control the gates 67. If, for example, a connection is desired from A1 62 to A3 65-3 and Am 65-m, then programmable control lines P2 66-3 & Pm 66-m are gated high to turn on gates 67-3 and 67-m, respectively, while the remaining control lines remain low and turn off the remaining gates. Similarly, reversible connections are also possible because of the bi-directional capability of structure 41. To connect A2 65-2 with A1 62, programmable elements turn P2 66-2 high so as to turn on gate 67-2 while the remaining control lines P3 to Pm remain low to keep gates 67-3 to 67-m turned off.

Figure 8:
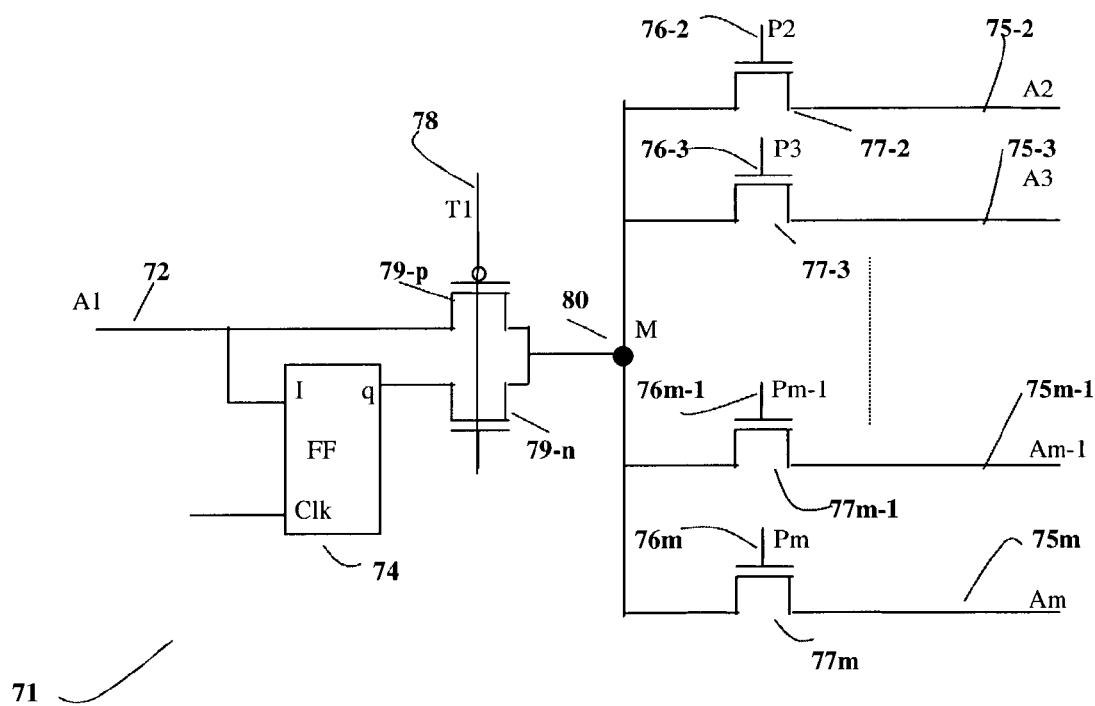
FIG. 8 shows the circuit diagram of an interconnecting circuit block modified according to an embodiment of the invention.

FIG. 8 shows the schematic of a programmable routing matrix 71 according to an embodiment of the present invention. In this arrangement, the connections to the sequential-logic elements are provided with the help of the routing resources instead of the selection circuitry in the programmable logic block 30. Signal A1 72 can make a connection with any (or all) other points A2–Am 75 in two different modes—direct mode or registered mode.

In direct mode, a programming element turns T1 78 low to turn on gate 79-p and to turn off gate 79-n to pass the signal from A1 72 to node M 80 directly without registering it in flip-flop 74. In registered mode, the programming element turns T1 78 high to turn off gate 79-p and to turn on gate 79-n to pass the signal from A1 72 to node M 80 through flip-flop 74. Since gates 79-p and 79-n are complementary in nature and are controlled by a single control line T1 78, only one gate, either 79-p or 79-n, is switched on at any time to provide either direct or registered mode operation. Node M 80 can connect to any point A2-Am 75 by programming control of lines P2–Pm 76 to control the status of gates 77. To connect signal A1 72 to point A2 75-2, programming elements turn control line P2 76-2 high to turn on gate 77-2 while the remaining control lines A3–Am 76 are kept low to turn off the remaining gates 77-3 to 77-m. Gate 77-2 connects node M 80 to A2 75-2 and, hence, A1 72 to A2 75-2 either in direct mode or registered mode depending on the status of control line T1 78.

In this case, bi-directional connectivity is not possible in registered mode. In direct mode, which is activated by setting T1 78 low, signal A2 75-2 connects with A1 72 using gate 77-2 and gate 79-p which are bi-directional elements and, hence, provide bi-directional connecting. For registered mode, the unidirectional routing structure 71 can be converted to bi-directional by providing a flip-flop 74 at every node (A1 to Am)—in other words, by registering the data at A2 node and then connecting to A1. However, this requirement may utilize a relatively large amount of chip area.

Figure 9:
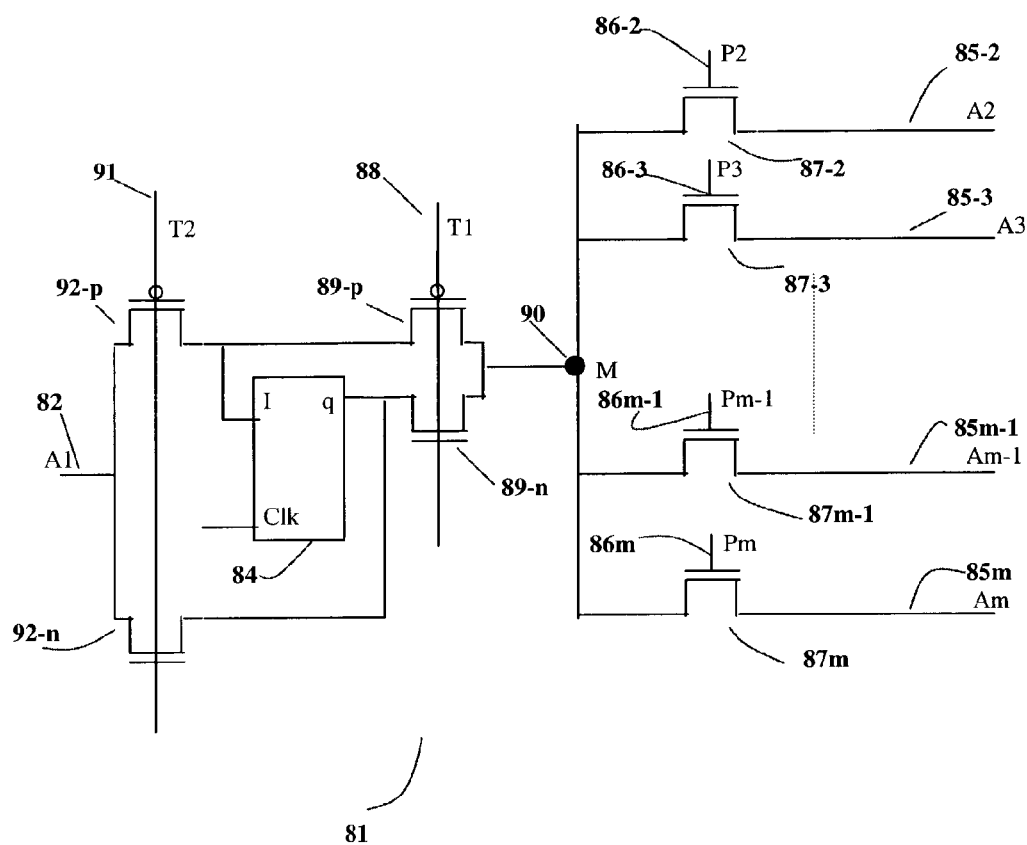
FIG. 9 shows the circuit diagram of a modified interconnecting circuit block that provides bi-directional access to the sequential logic-circuit elements in the PLB according to an embodiment of the invention.

FIG. 9 shows an embodiment of the present invention that provides bi-directional connectivity in both registered and direct modes. In this structure 81, there is an addition of gate pair 92 to select the direction of the signal. This type of structure has four different modes for connecting the signals—A1 82 to A2 85-2 direct mode, A1 82 to A2 85-2 registered mode, A2 85-2 to A1 82 direct mode and A2 85-2 to A1 82 registered mode. The same modes are also available for communications between A1 82 and A3 8503 Am 85-m.

In A1 82 to A2 85-2 direct mode, programming elements turn T2 91 and T1 88 low and, hence, gates 92-p and 89-p are on to connect A1 82 directly to node M 90. Gates 92-n and 89-n are switched off. To connect node M 90 to point A2 85-2, programming elements turn control line P2 86-2 high to turn on gate 87-2 while the remaining control lines remain low to switch off gates 87-3 to 87-m. In the same configuration, signal A2 85-2 is able to drive point A1 82, and, hence, connect A2 85-2 to A1 82 in direct mode.

In A1 82 to A2 85-2 registered mode, programming elements turn control line T2 91 low to switch on gate 92-p and T1 88 high to switch on gate 89-n. In this configuration, gates 92-n and 89-p remain off. Gates 92-p and 89-n provide the signal A1 82 at node M 90 through flip-flop 74. To connect this registered signal at node M 90 with point A2 85-2, programming elements turn control line P2 86-2 high to turn on gate 87-2 while the remaining control lines remain low to switch off gates 87-3 to 87-m.

For reversed connection from A2 85-2 to A1 82 in registered mode, programming elements turn T2 91 high to switch on gate 92-n & T1 88 low to switch on gate 89-p. In this configuration, because of T2 91 being high and T1 88 low, gates 92-p and 89-n remain off. To connect A2 85-2 to node M 90, programming elements turn control line P2 86-2 high to turn on gate 87-2 while the remaining control lines remain low to switch off gates 87-3 to 87-m. Gate 89-p connects node M 90 to the input of the flip-flop 84 and gate 92-n connects flip-flop 84 output to A1 82, and, hence, provide connectivity from A2 85-2 to A1 82 through flip flop 84.

In this manner, this structure 81 provides a programmable bi-directional routing connectivity in both registered and direct modes. Since each PLB 30 is surrounded by this type of routing structure, sequential elements can be provided in the routing structure 35 instead of in the PLB 30. This routing resource structure 81 provides a group or bank of flip-flops 84 which are accessible to all PLBs. Therefore, this architecture increases the utilization of unused resources (flip-flops) by providing accessibility to all parts of the FPGA.

An FPGA that includes programmable routing matrices such as the matrices 71 and 81 (FIGS. 8 and 9), can be included in an electronic system, such as a computer system, and be coupled to a processor or other circuit. In addition, the programmable routing matrices 71 and 81 may be embedded in a processor or other circuit other than FPGA.

It will be apparent to those with ordinary skill in the art that the foregoing is merely illustrative intended to be exhaustive or limiting, having been presented by way of example only and that various modifications can be made within the scope of the above invention.

Accordingly, this invention is not to be considered limited to the specific examples chosen for purposes of disclosure, but rather to cover all changes and modifications, which do not constitute departures from the scope of the present invention. The invention is therefore not limited by the description contained herein or by the drawings.

What is claimed is:

1. An improved programmable logic device architecture that provides more efficient utilization of resources by enabling access to a defined sequential circuit element in a routing domain associated with a programmable logic block from any other programmable logic block in the device, by incorporating a connecting means in the routing structure operable to selectively connect an input of the defined sequential circuit element in the routing domain to a first signal-pass node of a common interconnect matrix connecting all the programmable logic blocks together via no circuit element other than one or more switch elements and to simultaneously connect an output of the logic circuit element to a second signal-pass node of the common interconnect matrix.

2. An improved programmable logic device architecture as claimed in claim 1 wherein said connecting means is a controlled gate structure that selectively enables the input of the defined sequential circuit element to the interconnect matrix, based on the value of a selection input.

3. An improved programmable logic device architecture as claimed in claim 1 wherein said connecting means provides bi-directional access to the input of the defined sequential circuit element.

4. An improved programmable logic device architecture as claimed in claim 1 wherein the defined sequential circuit element is operable to be coupled to a combinatorial circuit element.

5. A method for improving the utilization of programmable—logic—device resources by enabling access to a defined sequential logic circuit element in the domain of any programmable logic block by selectively connecting an input of the logic circuit element to a first signal-pass node of a common interconnect matrix connecting all the programmable logic blocks together via no circuit element other than one or more pass gates and by simultaneously connecting an output of the logic circuit element to a second signal-pass node of the common interconnect matrix.

6. A method as claimed in claim 5 wherein selective connection is accomplished by connecting a particular input of the logic circuit element to the interconnect matrix, based on the value of a selection input.

7. A method for improving the utilization of programmable-logic-device resources by enabling access to a defined sequential logic circuit element in the domain of any programmable logic block by selectively connecting an input of the logic circuit element to a first signal-pass node of a common interconnect matrix connecting all the programmable logic blocks together via no circuit element other than one or more pass gates and by simultaneously connecting an output of the logic circuit element to a second signal-pass node of the common interconnect matrix, further comprising causing a signal to propagate bi-directionally between the first and second signal-pass nodes.

8. An integrated circuit, comprising:
first and second programmable logic blocks; and
routing resources adjacent to the first programmable logic block and including a sequential logic element having an input and an output, the routing resources operable to couple the input of the sequential logic element to the second logic block via no circuit element other than one or more pass gates and to simultaneously couple the output of the sequential logic element to either the input of one of the programmable logic blocks or to the second logic block.

9. An integrated circuit, comprising:
programmable logic blocks;
routing resources adjacent to one of the programmable logic blocks and including a sequential logic element having an input and an output, the routing resources operable to couple the input of the sequential logic element to one of the logic blocks via no circuit element other than one or more pass gates and to simultaneously couple the output of the sequential logic element to one of the programmable logic blocks;
a tile section;
wherein the routing resources and the adjacent programmable logic block are located within the tile section; and
at least one of the logic blocks coupled to the input and output of the sequential logic element is located outside of the tile section.

10. The integrated circuit of claim 8 wherein the sequential logic element is coupled to a combinatorial logic element.

11. The integrated circuit of claim 8 wherein the routing resources are operable to couple the input and output of the sequential logic element to the same one of the logic blocks.

12. The integrated circuit of claim 8 wherein the sequential logic element comprises a flip-flop.

13. An integrated circuit comprising:
programmable logic blocks; and
routing resources adjacent to one of the programmable logic blocks and including a sequential logic element having an input and an output, the routing resources operable to couple the input of the sequential logic element to one of the logic blocks via no circuit element other than one or more pass gates and to simultaneously couple the output of the sequential logic element to one of the programmable logic blocks;
wherein the routing resources are operable to allow bidirectional communication between the logic block coupled to the input of the sequential logic element and the logic block coupled to the output of the sequential logic element.

14. An integrated circuit comprising:
programmable logic blocks; and
routing resources adjacent to one of the programmable logic blocks and including a sequential logic element having an input and an output, the routing resources operable to couple the input of the sequential logic element to one of the logic blocks via no circuit element other than one or more pass gates and to simultaneously couple the output of the sequential logic element to one of the programmable logic blocks;

wherein the routing resources are operable to allow bidirectional communication via the sequential logic element between the logic block coupled to the input of the sequential logic element and the logic block coupled to the output of the sequential logic element.

15. The integrated circuit of claim 8 wherein the routing resources are operable to couple the input and output of the sequential logic element to different ones of the logic blocks that are not adjacent to the routing resources.

16. An electronic system, comprising:
a first integrated circuit, comprising,
first and second programmable logic blocks, and
routing resources adjacent to the first programmable logic blocks and including a sequential logic element having an input and an output, the routing resources operable to couple the input of the sequential logic element to the second logic blocks via no circuit element other than one or more pass gates and to simultaneously couple the output of the sequential logic element to either the input of one of the programmable logic blocks or to the second logic block.

17. The electronic system of claim 16, further comprising a second integrated circuit coupled to the first integrated circuit.

18. The electronic system of claim 16 wherein the first integrated circuit comprises a field-programmable gate array.

19. An electronic circuit, comprising:
a circuit node input operable to receive a logic signal;
a flip-flop having an input node and an output node, the input node coupled with the circuit input node via no circuit element other than one or more first switches;
a second switch operable to couple the circuit input node with a distribution node;
a third switch operable to couple the flip-flop output node with the distribution node; and
a plurality of distribution switches, each distribution switch operable to couple the distribution node to a respective distribution output node.

20. The electronic circuit of claim 19 wherein:
the second and third switches each have a respective couple state and a respective decouple state; and
the couple/decouple states of the second switch and the third switch are mutually exclusive.

21. An electronic circuit comprising:
a circuit node input operable to receive a logic signal;
a flip-flop having an input node and an output node, the input node coupled with the circuit input node;
a first switch operable to couple the circuit input node with a distribution node;
a second switch operable to couple the flip-flop output node with the distribution node;
a plurality of distribution switches, each distribution switch operable to couple the distribution node to a respective distribution output node;
a third switch operable to couple the circuit input node to the first switch; and
a fourth switch operable to couple the circuit input node to the second switch.

22. The electronic circuit of claim 21 wherein:
the third and fourth switches each have a respective couple state and a respective decouple state; and
the couple/decouple states of the third switch and the fourth switch are mutually exclusive.

23. A method, comprising:
routing an input node of a sequential logic element disposed within a routing matrix to a first signal-pass node of the routing matrix via no circuit element other than one or more switches, the routing matrix associated with a programmable logic block; and
simultaneously routing an output node of the sequential logic element to a second signal-pass node of the routing matrix.

24. The method of claim 23 wherein the sequential logic element comprises a flip-flop.

25. The integrated circuit of claim 8 wherein the routing resources are operable to respectively couple the input and output of the sequential logic element to different ones of the logic blocks, one of the logic blocks being adjacent to the routing resources.

* * * * *